(12) United States Patent
Abdel-Dayem (10) Patent No.: US 11,923,347 B1
(45) Date of Patent: Mar. 5, 2024

(54) SEMICONDUCTOR PACKAGE WITH MULTIPLE INTERPOSERS ON A SINGLE SUBSTRATE

(71) Applicant: Amazon Technologies, Inc., Seattle, WA (US)

(72) Inventor: Bassam Abdel-Dayem, Santa Clara, CA (US)

(73) Assignee: Amazon Technologies, Inc., Seattle, WA (US)

( * ) Notice: Subject to any disclaimer, the term of this patent is extended or adjusted under 35 U.S.C. 154(b) by 220 days.

(21) Appl. No.: 17/547,131

(22) Filed: Dec. 9, 2021

(51) Int. Cl.
| | |
|---|---|
| *H01L 25/10* | (2006.01) |
| *H01L 21/52* | (2006.01) |
| *H01L 23/498* | (2006.01) |
| *H01L 23/538* | (2006.01) |
| *H01L 25/00* | (2006.01) |
| *H05K 7/14* | (2006.01) |

(52) U.S. Cl.
CPC ............ *H01L 25/105* (2013.01); *H01L 21/52* (2013.01); *H01L 23/49833* (2013.01); *H01L 23/5385* (2013.01); *H01L 25/50* (2013.01); *H05K 7/1488* (2013.01)

(58) Field of Classification Search
CPC . H01L 25/105; H01L 21/52; H01L 23/49833; H01L 23/5385
USPC ......................................................... 361/784
See application file for complete search history.

(56) References Cited

U.S. PATENT DOCUMENTS

| | | | |
|---|---|---|---|
| 2014/0014599 A1* | 1/2014 | Florence, Jr. ........ | H05K 7/1488 29/525.01 |
| 2021/0343690 A1* | 11/2021 | Salmon .............. | H05K 7/20463 |

* cited by examiner

*Primary Examiner* — Andargie M Aychillhum
(74) *Attorney, Agent, or Firm* — Kilpatrick Townsend & Stockton LLP (57) ABSTRACT

A semiconductor package can include a unitary substrate defining a first region and a second region. A first interposer can be mounted on the unitary substrate in the first region, and a first die can be mounted on the first interposer. A second interposer can be mounted in the second region on the unitary substrate, and a second die can be mounted on the second interposer.

20 Claims, 5 Drawing Sheets

SEMICONDUCTOR PACKAGE WITH MULTIPLE INTERPOSERS ON A SINGLE SUBSTRATE

BACKGROUND

In semiconductor manufacturing, a package may correspond to a suitable container and/or assembly for holding a semiconductor die. The package may protect the die, dissipate heat, connect the die to other dice or components, and/or perform other important functions.

Designs of packages may often be constrained by sizing and/or spacing considerations. Sizing of components and/or spacing among components accordingly can be important factors in fabrication of semiconductor packages.

BRIEF DESCRIPTION OF THE DRAWINGS

Various embodiments in accordance with the present disclosure will be described with reference to the drawings, in which.

DETAILED DESCRIPTION

Various examples described herein are directed to systems or techniques relating to semiconductor packages. The semiconductor packages can include substrates, interposers, and dice. A die may be mounted on an interposer and form a subassembly. The subassembly may be sized to permit multiple subassemblies to be mounted on a single substrate. For example, one substrate may include a first region in which a first interposer is mounted and bears a first die. The same substrate may include a second region in which a second interposer is mounted and bears a second die.

Using two relatively smaller interposers on a single substrate instead of a single relatively larger interposer may facilitate ease and/or speed of testing and verification. For example, where a relatively larger interposer may be subject to more complex verification simulations, a relatively smaller interposer may be simpler to verify in simulation.

Additionally, using identical subassemblies may allow a verification simulation to be applicable in multiple contexts. For example, in one set of packages, two instances of a subassembly may be included on a particular substrate, and in another set of packages, an individual instance of a subassembly may be included on an individual substrate instead. Using identical instances of the subassemblies across the different sets and/or types of packages may allow a corresponding verification simulation to apply across multiple scenarios and avoid costs and time of different simulations for each individual scenario.

In some examples, including multiple subassemblies on a single substrate can simplify system design. For example, less space may be occupied by a package with a single substrate bearing a number of dice within subassemblies having accompanying interposers than if a same number of dice were each included in their own individual packages involving separate substrates. Additionally or alternatively, a single substrate bearing multiple subassemblies of interposer-mounted dice may provide suitable interoperability among the dice and may obviate re-timers, cabling, or other additional structure that may be present and/or incur additional costs (such as in terms of space, complexity, materials, installation, maintenance, or other criteria) in arrangements in which multiple packages with separate substrates are utilized.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Figure 1:
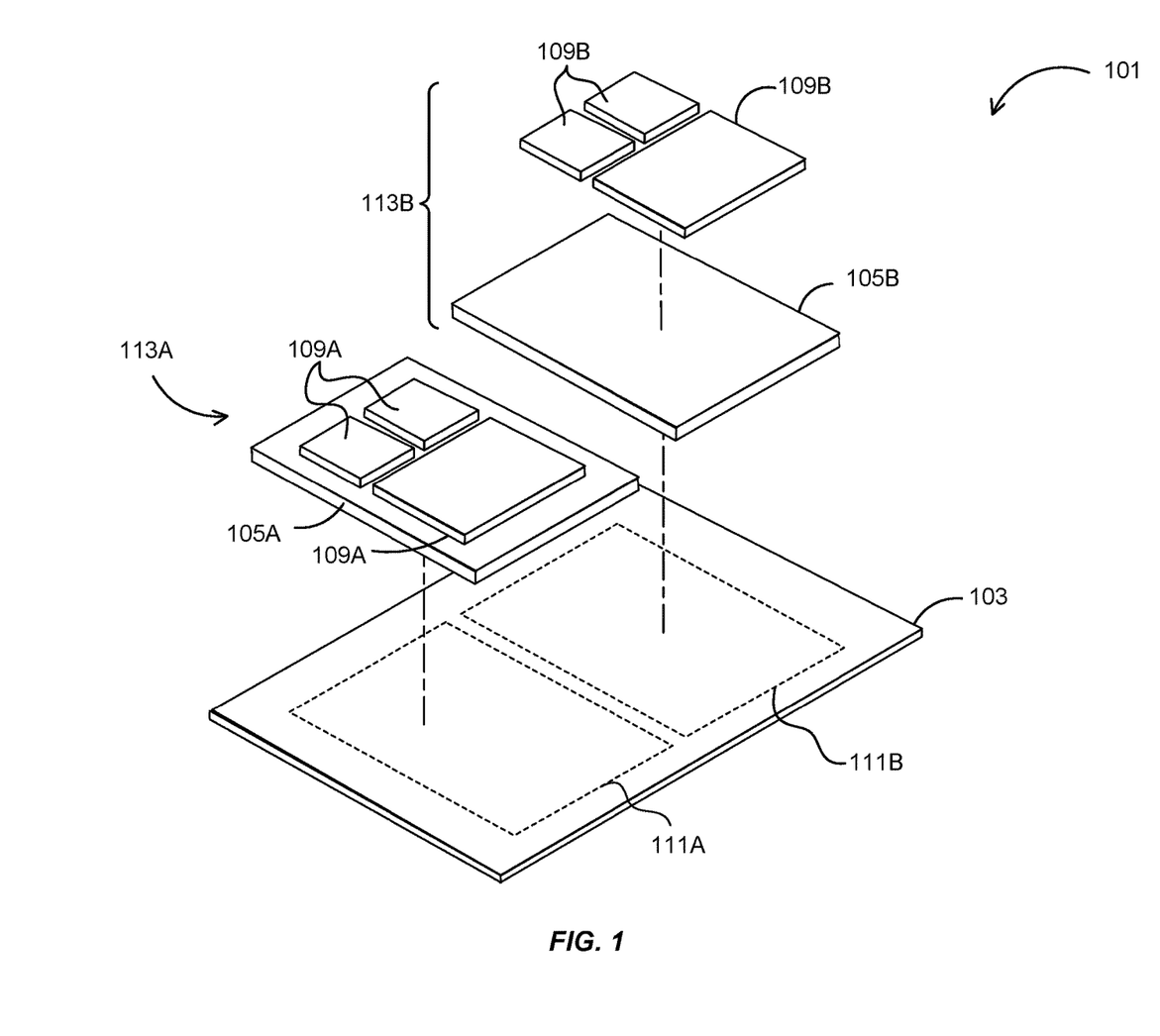
FIG. 1 illustrates an exploded assembly view of elements of a semiconductor package in accordance with various embodiments.

FIG. 1 illustrates an example of a semiconductor package 101. The package 101 is depicted with a substrate 103, interposers 105 (e.g., individually identified as a first interposer 105A and a second interposer 105B), and dice 109 (e.g., individually identified as a group of first dice 109A and a group of second dice 109B), although other combinations of fewer, more, or different elements may be utilized. In use, the package 101 may be borne by a motherboard or otherwise contained within a server assembly, for example. The package 101 is also shown in an assembled state in a side view in FIG. 2.

The substrate 103 can correspond to suitable structure for receiving other components. The substrate 103 may be the substrate portion of a chip-on-wafer-on-substrate (CoWoS) assembly, for example. The substrate 103 may include silicon, fiberglass, or other suitable organic or non-organic materials. The substrate 103 can include connections sized on a micro-meter scale or otherwise suitably sized for connection with the interposer 105.

The interposer 105 may include a suitable body with elements that can allow connection between the substrate 103 and the die 109. The interposer 105 may be the wafer portion of a chip-on-wafer-on-substrate (CoWoS) assembly, for example. The interposer 105 may include silicon, fiberglass, or other suitable organic or non-organic materials. The interposer 105 may include suitable features for spreading a connection from the die 109 to a wider pitch for interoperability with the substrate 103. In some examples, the interposer 105 on an upper side includes connections sized on a nano-meter scale for connection with the die 109 and on a lower side includes connections sized on a micro-meter scale for connection with the substrate 103. The different scales of connections may be coupled via tracings or other suitable structures extending within the interposer 105, for example.

At least one die 109 may be included on each interposer 105. The die 109 may be the chip portion of a chip-on-wafer-on-substrate (CoWoS) assembly, for example. Although each interposer 105 is shown with three dice 109 by way of example, other arrangements are possible. Any suitable number dice 109 may be utilized, including one, two, three, or more than three. Any suitable type of dice 109 can be utilized individually or in combination. Examples of suitable types of dice 109 can include any type of integrated circuit, for example, memory dice, compute dice, logic dice, accelerators, and application-specific integrated circuits (ASICs). The die 109 can include connection features at a specific scale suitable for engaging the interposer 105. For example, the die 109 can include connections sized on a nano-meter scale or otherwise suitably sized for connection with the interposer 105.

The substrate 103 may correspond to a unitary substrate, e.g., integrally formed from a single monolithic mass of material. The substrate 103 can include different regions 111. For example, a first region 111A and a second regions 111B are shown in FIG. 1. Although two regions 111 are depicted, any number of regions 111 may be included, including one, two, or more than two. The regions 111 may be arranged to be non-overlapping relative to one another.

The number of regions 111 may facilitate receipt of a corresponding number of subassemblies 113. Each subassembly 113 can include a respective interposer 105 and die or dice 109, for example. The subassemblies 113 may be identical or different from one another, e.g., including identical and/or different interposers 105 and/or dice 109. For example, the interposers 105A and 105B may be identical, or they may have different sizes and/or shapes. The subassemblies 113 may be installed as a unit or as individual parts. For example, FIG. 1 depicts a first subassembly 113A that includes the first dice 109A already mounted on the first interposer 105A, while the second subassembly 113B is shown with the second interposer 105B and the second dice 109B separate yet aligned for mounting together in a stack on the substrate 103. Respective subassemblies 113 may be received in respective regions 111 of the substrate 103. For example, in FIG. 1, the first subassembly 113A may be installed in the first region 111A (e.g., such that the first interposer 105A is mounted on the substrate 103 in the first region 111A), and the second subassembly 113B (e.g., which may be physically distinct from the first subassembly 113A) may be installed in the second region 111B (e.g., such that the second interposer 105B is mounted on the substrate 103 in the second region 111B).

Figure 2:
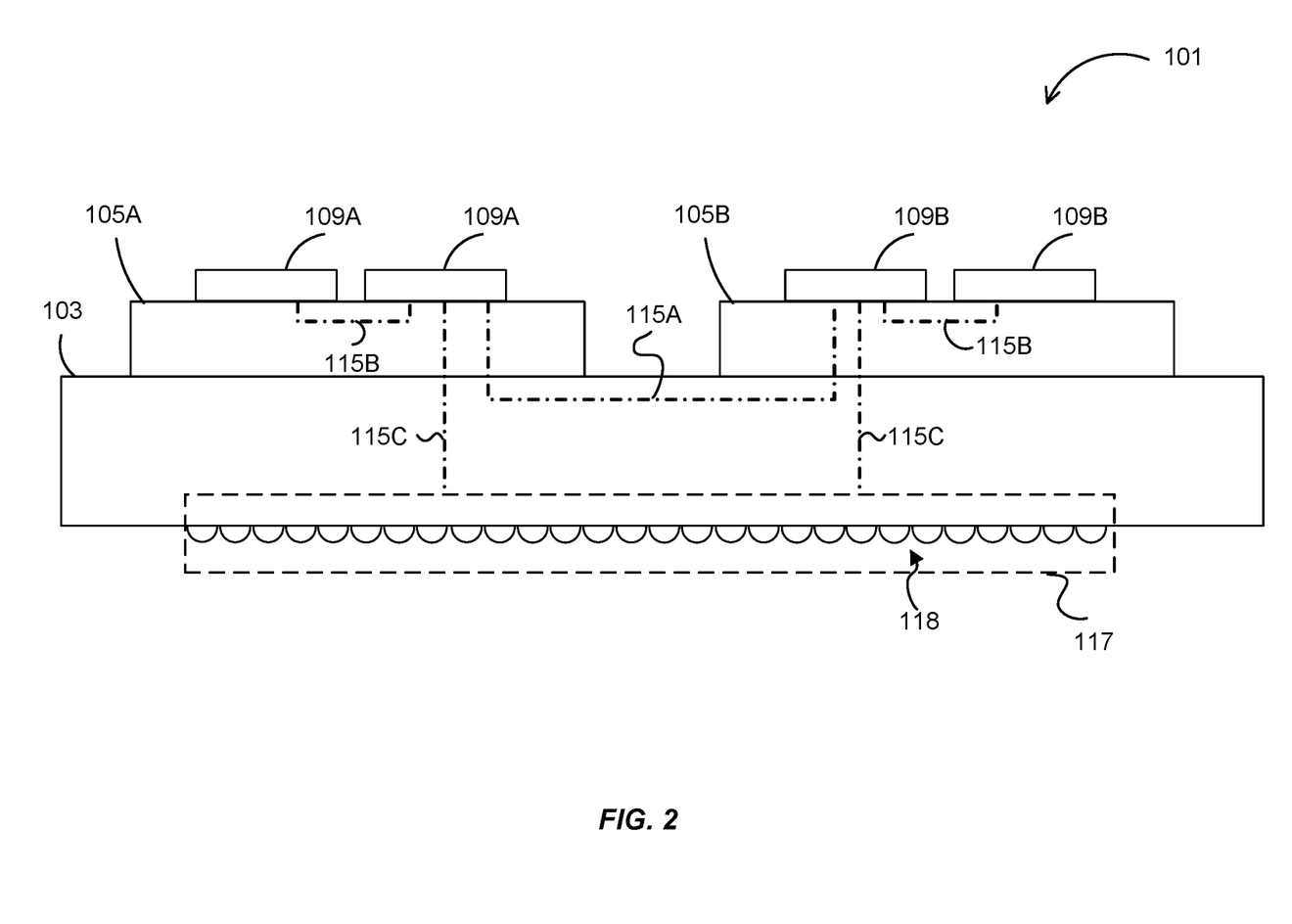
FIG. 2 illustrates a side view of the package of FIG. 1 in accordance with various embodiments.

FIG. 2 illustrates a side view of the package 101. The package 101 can include suitable features to facilitate interoperability of components within the package 101 with each other and/or with components external to the package 101.

Suitable pathways may be formed using traces (of copper or other material), vias, or other suitable structures. Various types of pathways are shown schematically with dot-dash lines by way of example in FIG. 2, although other combinations of fewer, more, or different routings may be utilized.

As one example, an electrical pathway 115A may extend from the first die 109A, through the first interposer 105A, through the unitary substrate 103, through the second interposer 105B, and to the second die 109B. The electrical pathway 115A may include at least a portion extending between the first region 111A (FIG. 1) and the second region 111B of the substrate 103, for example. The respective connections and/or segments within the electrical pathway 115A may be sufficiently low loss to permit connection of a first die 109A to a second die 109B through the first interposer 105A, the substrate 103 and the second interposer 105B.

As may also be seen in FIG. 2, a given interposer 105 may include an electrical pathway 115B or other suitable structure for connecting components of a same level of the package 101 (e.g., for connection among dice 109 each borne by the same interposer 105). The pathway 115B among components on a same level may be present in addition to the portion of the pathway 115A through the interposer 105 that may be present for providing connection among components at different levels (e.g., for connection among the die 109 over the interposer 105 and the substrate 103 below the interposer 105).

The substrate 103 may further include a suitable interface 117 for connection to other components. Although the interface 117 is schematically depicted as a functional block, suitable examples of the structures of the interface 117 may include connectors (e.g., Peripheral Component Interconnect Express (PCIE) or another variety of connector) and/or a ball grid array (BGA) 118 or other type of mounting arrangement. The interface 117 may provide connection to cables and/or a motherboard, for example. Moreover, although the interface 117 is schematically depicted as arranged along an underside of the substrate 103, the interface 117 additionally may include structures along a top side or other portion of the substrate 103. A suitable electrical pathway 115C may extend from the interface 117 through the substrate 103 for connection to other components. For example, portions of the electrical pathway 115C from the interface 117 of the substrate 103 may extend through the interposer 105 and/or through or into a given die 109.

Sizing of the interposer 105 and the die 109 so that multiple corresponding subassemblies 113 can fit on the substrate 103 may allow use of the subassemblies 113 in multiple contexts. One example is discussed with respect to FIGS. 3 and 4.

Figure 3:
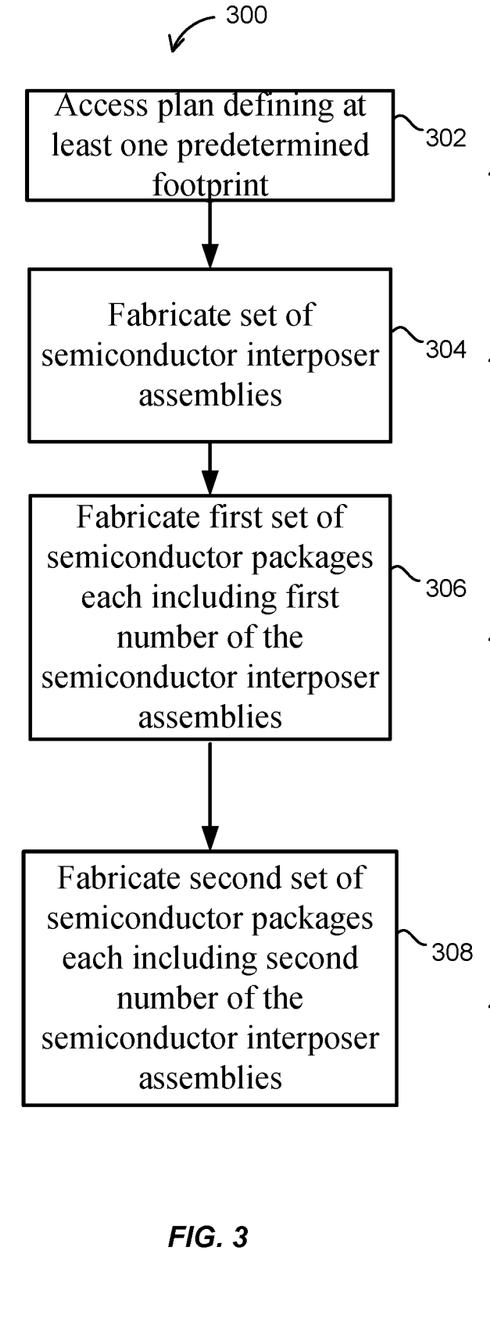
FIG. 3 is a flow diagram depicting an example process for constructing semiconductor packages as described herein, in accordance with various embodiments.
Figure 4:
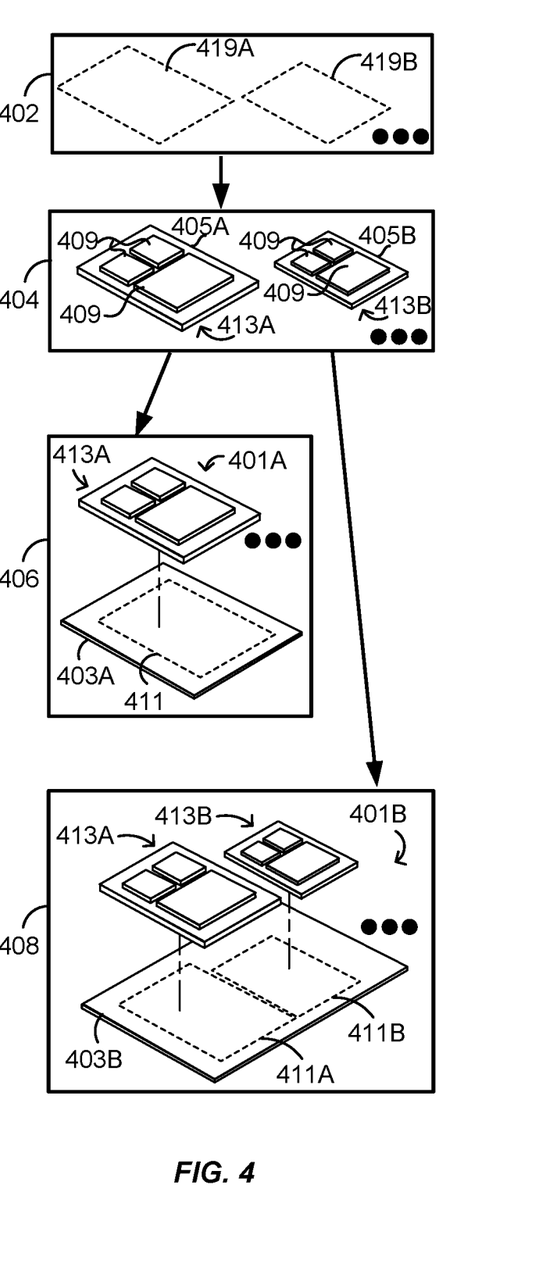
FIG. 4 illustrates various examples of components that may be implemented in the example process of FIG. 3, in accordance with various embodiments.

FIG. 3 is a flow diagram depicting an example process 300, and FIG. 4 illustrates various examples of components that may be implemented in that process 300. Various blocks of the process 300 are described by referencing blocks 402 through 408 of FIG. 4, however, additional and/or alternative components may be used with the process 300. Some or all of the components in FIG. 4 can be examples of components from FIG. 1 of similar name and reference numeral, although additional and/or alternative components may be used.

The process 300 at block 302 can include accessing a plan (e.g., a design). The plan can define a predetermined footprint 419, such as depicted in block 402. The footprint 419 can correspond to a particular area. For example, the footprint 419 may correspond in size to a region 111 of the substrate 103. Multiple footprints 419 (such as a relatively larger footprint 419A or a relatively smaller footprint 419B) may be utilized in some examples.

The process 300 at block 304 can include fabricating a set (e.g., an initial set) of semiconductor interposer assemblies 413, such as depicted in block 404. The initial set can include multiple semiconductor interposer assemblies 413 (e.g., as illustrated by the ellipse in block 404). The initial set can include multiple types of semiconductor interposer assemblies 413. For example, in block 404, a first type (denoted by the suffix A) and a second type (denoted by the suffix B) are shown in different sizes, although they may differ or be the same as each other in any or all aspects of design (including size or other characteristics). The initial set of semiconductor interposer assemblies 413 may be examples of the subassemblies 113, for example. The initial set of semiconductor packages 413 can be fabricated according to the plan that includes the footprint(s) 419. The initial set of semiconductor packages 413 can be fabricated so that each comprises an interposer 405 and at least one die 409 mounted on the interposer 405. For example, the die 409 may be included in a group that may include one or more dice 409. The initial set of semiconductor packages 413 can be fabricated so that each includes an interposer 405 having a predetermined footprint 419 from the plan. For example, the first type of semiconductor interposer assemblies 413A may be fabricated with a relatively larger interposer 405A sized according to the relatively larger footprint 419A, while the second type of semiconductor interposer assemblies 413B may be fabricated with a relatively smaller interposer 405B sized according to the relatively smaller footprint 419B.

The process 300 at block 306 can include fabricating a first set of semiconductor packages 401A, such as depicted in block 406. Although an individual semiconductor package 401A is shown in block 406, the first set can include multiple semiconductor packages 401A (e.g., as illustrated by the ellipse in block 406).

As may also be seen in block 406, the semiconductor packages 401A can be fabricated so that each includes a first type of substrate 403A. For example, the first type of substrate 403A can be a first size. The semiconductor packages 401A can be fabricated so that each further includes a first number of the semiconductor interposer assembly 413 borne by the substrate 403A. For example, in block 406, the first number may be the number one such that each substrate 403A bears one semiconductor interposer assembly 413 apiece. The first size of the first type of substrate 403A may be sized to include a region 411 for each semiconductor package interposer 413 (e.g., including the first number of regions 411, or one such region 411 in block 406).

The process 300 at block 308 can include fabricating a second set of semiconductor packages 401B, such as depicted in block 408. Although an individual semiconductor package 401B is shown in block 408, the second set can include multiple semiconductor packages 401B (e.g., as illustrated by the ellipse in block 408).

As may also be seen in block 408, the semiconductor packages 401B can be fabricated so that each includes a second type of substrate 403B. For example, the second type of substrate 403B can be a second size (e.g., which may differ from the first size of the first type of substrate 403A of block 406). The semiconductor packages 401B can be fabricated so that each further includes a second number of the semiconductor interposer assemblies 413 borne by the substrate 403B. For example, in block 408, the second number may be the number two such that each substrate 403B bears two semiconductor interposer assemblies 413 apiece. The second size of the second type of substrate 403B may be sized to include a region 411 for each semiconductor interposer assembly 413 (e.g., including the second number of regions 411, or two such regions 411 in block 408). The regions 411 may be arranged to be non-overlapping relative to one another. The regions 411 may be sized according to the size of the respective interposer assemblies 413 to be received, such as a relatively larger region 411A for a relatively larger interposer assembly 413A or a relatively smaller region 411B for a relatively smaller interposer assembly 413B, although the sizes of the regions 411 and/or accompanying interposer assemblies 413 may be the same or different from one another.

The first type of substrate 403A and the second type of substrate 403B may be different types from each other, e.g., such that they may have a variation from one another. As one example, the variation may be a difference in size. Other variations are also possible, such as routing of tracing or other elements within or on the first type of substrate 403A and/or the second type of substrate 403.

Although FIG. 4 shows examples in which the first number is one and the second number is two, any other combination of the first number and the second number can be utilized. As further illustrative examples, the first number may be one or two and/or the second number may be eight, although any other combination may be utilized. Using semiconductor interposer assemblies 413 across the different sets and/or types of packages 401 may allow a corresponding verification simulation to apply across multiple scenarios and avoid costs and time of different simulations for each individual scenario.

In some embodiments, the process 300 can be utilized to fabricate a set of relatively larger or expanded semiconductor packages and a set of relatively smaller or compact semiconductor packages. For example, the process at block 308 may correspond to fabricating a set (as at block 408) of relatively larger or expanded semiconductor packages 401B that each include a first-size substrate 403B and a first subset of at least two of the interposer assemblies 413. The first subset may be mounted on the first-size substrate 403B and can include the first type of interposer assembly 413A and the second type 413A (which may be of different sizes and/or designs as depicted or may be the same as one another). Further, the process at block 308 may correspond to fabricating a set (as at block 406) of relatively smaller or compact semiconductor packages 401A that each include a second-size substrate 403A (e.g., of a size smaller than the first-size substrate 403B) and a second subset of the interposer assemblies 413. The second subset may be mounted on the second-size substrate 403A and can include at least one of the first type of interposer assembly 413A or the second type of interposer assembly 413B in a number less than is present in the first subset. As an illustrative example, where block 408 shows a relatively larger or expanded semiconductor package 401B with one each of the first type of interposer assembly 413A and the second type of interposer assembly 413B, block 406 in contrast shows the relatively smaller or compact semiconductor packages 401A with one of the first type of interposer assembly 413A and zero of the second type of interposer assembly 413B (i.e., less than the one of the second type of interposer assembly 413B shown in the relatively larger or expanded semiconductor package 401B). However, the relatively smaller or compact semiconductor packages 401A is not limited to the arrangement depicted and can include other arrangements, including, but not limited to one or more of either or both of the first type of interposer assembly 413A or the second type of interposer assembly 413B or other types of interposer assemblies 413. Moreover, the process 300 is not limited to the order shown. For example, block 308 may be performed before or after block 306 (e.g., at least one of the relatively smaller or compact semiconductor packages 401A may be fabricated before or after at least one of the relatively larger or expanded semiconductor packages 401B).

Embodiments are not limited to the arrangements and/or structures depicted in FIGS. 1-4. In some embodiments, other numbers may be implemented and/or other structure may be utilized additionally and/or alternatively. Some further examples are discussed with respect to FIG. 5, for example.

Figure 5:
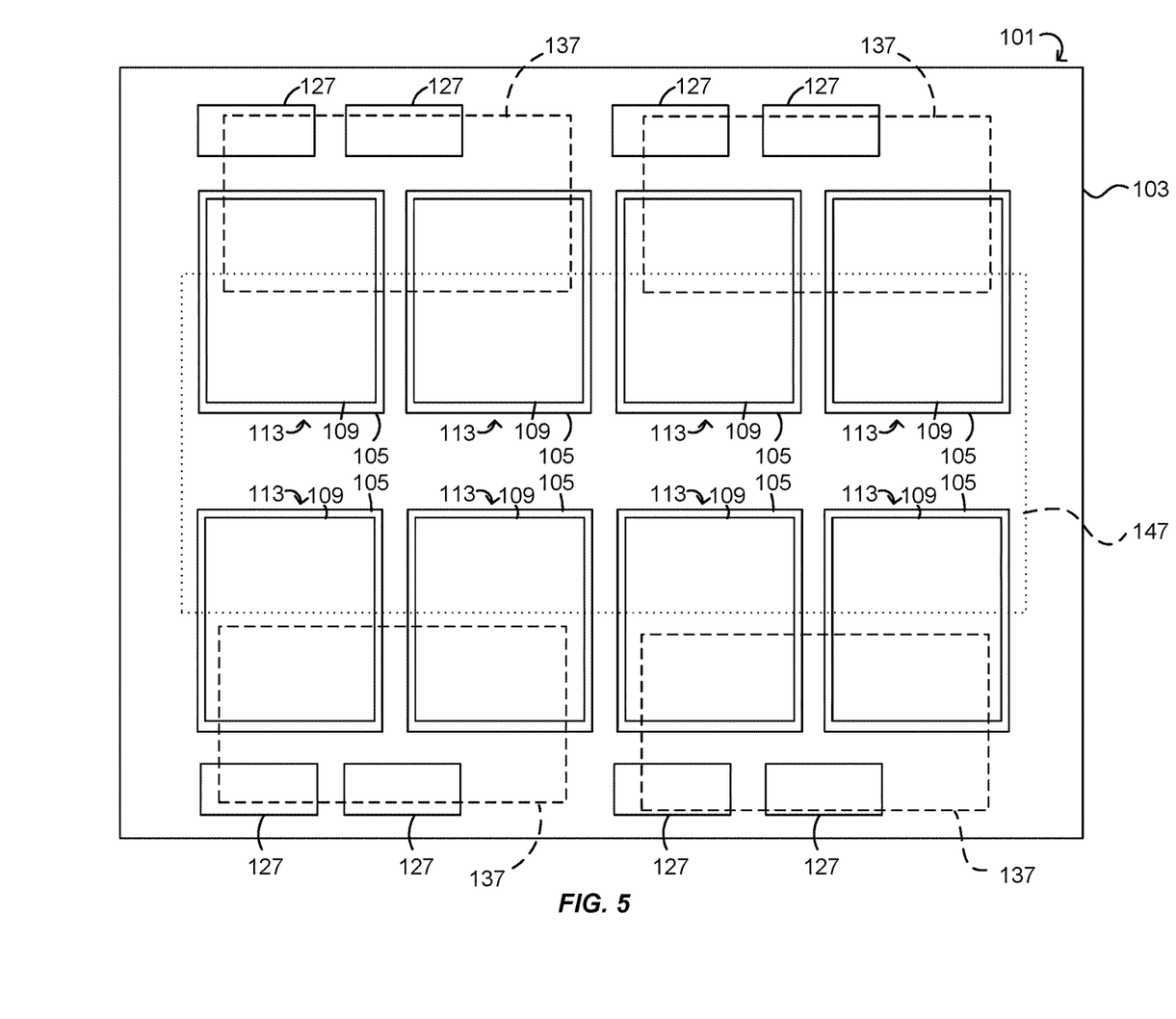
FIG. 5 illustrates a top view of a package in accordance with various embodiments.

FIG. 5 depicts a semiconductor package 101 with various differences from the arrangement in FIG. 1. For example, rather than just bearing two subassemblies 113 as in FIG. 1, the substrate 103 in FIG. 5 has been expanded so that the substrate 103 is suitably sized to bear eight subassemblies 113 that each includes a respective interposer 105 and a respective die 109. However, the package 101 may include any other number of subassemblies 113, and/or other elements described with respect to FIG. 5 may be utilized in other arrangements described herein.

The substrate 103 in FIG. 5 is also shown with connectors 127 atop the substrate 103. The connectors 127 may correspond to at least a portion of the interface 117. For example, the connectors 127 may be PCIE connectors and/or some other suitable form of connector. A respective one of the connectors 127 may provide connection to one or more of the respective dice 109, such as through one or more electrical pathways 115 (e.g., FIG. 2) that may extend through the substrate 103. For example, in FIG. 5, each respective connector 127 is shown proximate a different respective one of the dice 109 (e.g., that are within the subassemblies 113 and/or on the interposers 105), although other connections to one or more of the dice 109 may be utilized.

The substrate 103 in FIG. 5 is also shown with connectors 137 along an underside of the substrate 103. The connectors 137 may correspond to at least a portion of the interface 117. For example, the connectors 137 may include BGA balls and/or some other suitable form of connector. A respective one of the connectors 137 may provide connection to one or more of the respective dice 109, such as through one or more electrical pathways 115 (e.g., FIG. 2) that may extend through the substrate 103. For example, in FIG. 5, each respective connector 137 is shown in a suitable position for connecting with a different respective pair of the dice 109 (e.g., that are within the subassemblies 113 and/or on the interposers 105), although other connections to one or more of the dice 109 may be utilized.

The substrate 103 in FIG. 5 is also shown with a suitable power vehicle 147 along an underside of the substrate 103. The power vehicle 147 may correspond to at least a portion of the interface 117. For example, the power vehicle 147 may incorporate structure that may be included as part of or in place of either or both of the connectors 127 and the connectors 137 and/or may include other suitable structure for providing power to elements in or on the substrate 103.

In various embodiments, a compound package (e.g., a package 101 in which a single substrate 103 bears multiple stacks of interposers 105 supporting a die or dice 109) may provide benefits in comparison to other forms of packages. Some examples are described with respect to FIG. 6.

Figure 6:
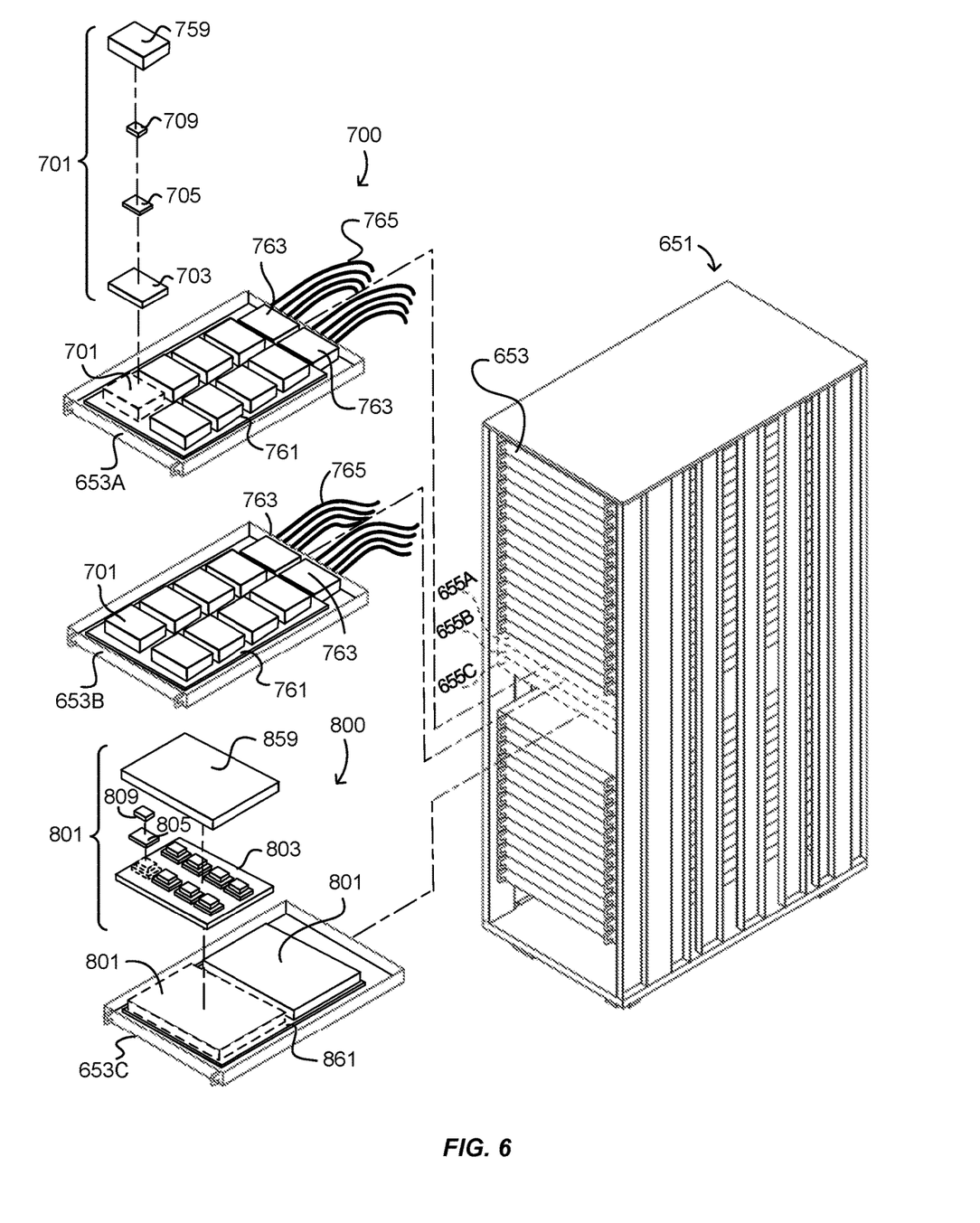
FIG. 6 illustrates an exploded view of examples of packages incorporated into a server rack in accordance with various embodiments.

FIG. 6 illustrates a rack 651 relative to which other components may be installed. The rack 651 may correspond to a server rack or other structure that may be utilized within a datacenter or other environment. The rack 651 can include vertical members, horizontal members, and/or any other suitable structure for supporting rack-mounted units 653. The rack-mounted units 653 may be or include servers and/or chassis and thus will alternatively be referred to as servers 653 or chassis 653 herein. However, the rack-mounted units 653 may additionally or alternatively be or include other structures, such as network switches or other units suitable for use in a datacenter, for example.

Each chassis 653 can be slidably received in the rack 651. FIG. 6 shows three chassis 653 outside the rack 651 for purposes of illustration. In FIG. 6, a first system 700 includes components installed relative to a first chassis 653A and a second chassis 653B, while a second system 800 includes components installed relative to a third chassis 653C. The first chassis 653A, the second chassis 653B, and the third chassis 653C are respectively shown as positionable respectively among a first volume 655A, a second volume 655B, and a third volume 655C that are arranged vertically adjacent and/or above one another within the rack 651, although any other suitable arrangement may be utilized.

The first system 700 can include singular packages 701, which may respectively include an individual substrate 703 bearing an individual interposer 705 on which an individual die or group of dice 709 is mounted. The singular packages 701 are also shown with individual superstructures 759, which may correspond to cooling components (such as heat sinks, fans, conduits for cooling, etc.) and/or any covers, stiffeners, or other components that may be placed on or over the individual packages 701.

The singular packages 701 may be mounted on a motherboard 761 that can provide connection between the singular packages 701 and each other and/or other elements. Re-timers 754 and/or other operability components may facilitate communication or other functions relative to the motherboard 761, such as through connection with a cable network 765 that may provide connection to other components. For example, the cable network 765 may include suitable cabling and/or connectors to provide communication between components located in the first chassis 653A and the second chassis 653B (which may include a similar or different arrangement than in the first chassis 653A).

The second system 800 can include at least one compound package 801. The compound package 801 may be an example of the package 101, such as described with respect to FIG. 5 and/or elsewhere herein. For example, the compound package 801 in FIG. 6 is shown with a single substrate 803 having eight subassemblies 813 that each include a respective interposer 805 and die or group of dice 809. The compound packages 801 may further include at least one superstructure 859, which may correspond to cooling components (such as heat sinks, fans, conduits for cooling, etc.) and/or any covers, stiffeners, or other components that may be placed on or over the compound package 801. Although the superstructure 859 is graphically represented as a single component or assembly that may extend over an entirety of the compound package 801, the superstructure 859 may include any suitable number of subparts that may each extend over a part or an entirety of the compound package 801.

Multiple compound packages 801 may be utilized. For example, the depicted system 800 is shown with two compound packages 801, e.g., which may be connected to one another through being mounted on a motherboard 861 and/or through other suitable structure.

Use of the compound packages 801 in the system 800 may provide various benefits compared to use of solely singular packages as in the system 700. Space savings may be achieved, which may be appreciated for example, noting that the two compound packages 801 of the system 800 are shown fitting within a single chassis 653 in contrast to the two chassis 653 utilized to fit all of the components of the system 700. Additionally or alternatively, use of the compound packages 801 may obviate and/or reduce an amount of components (such as the retimers 763 and/or the cable network 765) that may be utilized for connection in the system 700. Reduction in such components may provide savings in terms of space, complexity, materials, installation, maintenance, or other criteria, for example.

Based on the disclosure and teachings provided herein, a person of ordinary skill in the art will appreciate other ways and/or methods to implement the various embodiments. The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A server assembly, comprising:
    a server rack comprising a first server chassis and a second server chassis;
    a singular semiconductor package contained within the first server chassis and comprising:
        a singular substrate;
        a singular interposer mounted on the singular substrate; and
        at least one die mounted on the singular substrate; and
    a compound semiconductor package contained within the second server chassis, the compound semiconductor package comprising:
        a unitary substrate comprising a first region and a second region that are non-overlapping relative to one another;
        a first interposer mounted on the unitary substrate in the first region, wherein the first interposer has the same dimensions as the singular interposer in the singular semiconductor package;
        a first die mounted on the first interposer;
        a second interposer physically distinct from the first interposer and mounted in the second region on the unitary substrate; and
        a second die mounted on the second interposer.

2. The server assembly of claim 1, wherein the unitary substrate comprises eight non-overlapping regions each having mounted therein a respective subassembly including a respective interposer and a respective die.

3. The server assembly of claim 2, wherein the compound semiconductor package is a first compound semiconductor package, and wherein the server assembly further comprises:
    a second compound semiconductor package contained within the second server chassis and having a second unitary substrate comprising a second set of eight non-overlapping regions each having mounted therein a respective subassembly including a respective interposer and a respective die; and
    a motherboard coupled with the first compound semiconductor package and the second compound semiconductor package so as to provide communication therebetween.

4. The server assembly of claim 1, wherein the unitary substrate further comprises an interface comprising at least one connector configured for connecting the unitary substrate to components separate from the compound semiconductor package.

5. A semiconductor package, comprising:
    a unitary substrate defining a first region and a second region;
    a first interposer mounted on the unitary substrate in the first region;
    a first die mounted on the first interposer;
    a second interposer mounted in the second region on the unitary substrate; and
    a second die mounted on the second interposer.

6. The semiconductor package of claim 5, wherein the first region and the second region are non-overlapping relative to one another.

7. The semiconductor package of claim 5, wherein the second interposer has a different design than the first interposer.

8. The semiconductor package of claim 5, wherein the first interposer comprises:
    top connections sized to engage features of a first scale along a top of the first interposer;
    bottom connections sized to engage features of a second scale along a bottom of the first interposer; and
    interior paths between the top connections and the bottom connections so that the first interposer is configured for providing communication among the features of the first scale and the second scale.

9. The semiconductor package of claim 5, wherein the first die is in communication with the second die through an electrical path extending from the first die, through the first interposer, through the unitary substrate, through the second interposer, and to the second die.

10. The semiconductor package of claim 5, wherein the unitary substrate further comprises an interface comprising at least one connector configured for connecting the unitary substrate to components separate from the semiconductor package.

11. The semiconductor package of claim 5, further comprises a further die mounted on the first interposer in addition to the first die, and wherein the first interposer comprises tracing for establishing communication between the first die and the further die.

12. The semiconductor package of claim 5, wherein the semiconductor package is coupled to a server motherboard.

13. The semiconductor package of claim 5, wherein the unitary substrate comprises eight non-overlapping regions each having mounted therein a respective subassembly including a respective interposer and a respective die.

14. The semiconductor package of claim 5, wherein the second interposer has a different size than the first interposer.

15. A method comprising:
  fabricating a set of interposer assemblies that includes a first type of interposer assembly and a second type of interposer assembly, wherein each in the set of interposer assemblies comprises:
    an interposer; and
    at least two dice mounted on the interposer;
  fabricating a set of relatively larger or expanded semiconductor packages that each include:
    a first-size substrate; and
    a first subset of at least two of the interposer assemblies, the first subset mounted on the first-size substrate and including the first type of interposer assembly and the second type of interposer assembly; and
  fabricating a set of relatively smaller or compact semiconductor packages that each include:
    a second-size substrate of a size smaller than the first-size substrate; and
    a second subset of the interposer assemblies, the second subset mounted on the second-size substrate and including at least one of the first type of interposer assembly or the second type of interposer assembly in a number less than is present in the first subset.

16. The method of claim 15, wherein the first subset includes exactly two of the interposer assemblies and the second subset includes exactly one interposer assembly.

17. The method of claim 15, wherein the first type of interposer assembly is the same as the second type of interposer assembly.

18. The method of claim 15, wherein at least one of the relatively smaller or compact semiconductor packages is fabricated before at least one of the relatively larger or expanded semiconductor packages.

19. The method of claim 15, wherein the first type of interposer assembly is a different design from the second type of interposer assembly.

20. The method of claim 15, wherein each of the first subset of semiconductor packages and each of the second subset of semiconductor packages is sized to be contained within a server chassis of a server assembly.

* * * * *